US008344097B2

(12) United States Patent
Katayama et al.

(10) Patent No.: US 8,344,097 B2
(45) Date of Patent: Jan. 1, 2013

(54) CATIONICALLY POLYMERIZABLE COMPOSITION AND METHOD FOR CONTROLLING CATIONIC POLYMERIZATION

(75) Inventors: Atsuhiko Katayama, Kitakyushu (JP); Niranjan Kumar Shrestha, Kitakyushu (JP); Keiji Banno, Kitakyushu (JP); Toshihide Senzaki, Tokyo (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 654 days.

(21) Appl. No.: 12/308,073

(22) PCT Filed: Jun. 12, 2007

(86) PCT No.: PCT/JP2007/061838
§ 371 (c)(1),
(2), (4) Date: Dec. 3, 2009

(87) PCT Pub. No.: WO2007/148566
PCT Pub. Date: Dec. 27, 2007

(65) Prior Publication Data
US 2010/0081785 A1 Apr. 1, 2010

(30) Foreign Application Priority Data
Jun. 20, 2006 (JP) .................... 2006-170068

(51) Int. Cl.
*C08G 59/00* (2006.01)
(52) U.S. Cl. .................... 528/417; 528/354; 528/410
(58) Field of Classification Search .................... 528/417, 528/354, 410
See application file for complete search history.

(56) References Cited

U.S. PATENT DOCUMENTS

| 5,395,959 A * | 3/1995 | Weyer et al. ................... 560/231 |
| 2006/0178449 A1* | 8/2006 | Tsuchimura et al. ......... 523/160 |

FOREIGN PATENT DOCUMENTS

| JP | 58-057429 | 4/1983 |
| JP | 58-118816 | 7/1983 |
| JP | 60-202120 | 10/1985 |
| JP | 05-005006 | 1/1993 |
| JP | 06-041215 | 2/1994 |
| JP | 08-283320 | 10/1996 |
| JP | 09-291144 | 11/1997 |
| JP | 10-310633 | 11/1998 |
| JP | 2001-030281 | 2/2001 |
| JP | 2001-200049 | 7/2001 |
| JP | 2003-292606 | 10/2003 |
| WO | WO-2007/032185 | 3/2007 |

OTHER PUBLICATIONS

Odian, Principle of Polymerization, 1991 by John Wiley & Sons, Inc.*
International Search Report mailed Sep. 11, 2007, issued on PCT/JP2007/061838.

* cited by examiner

Primary Examiner — Shane Fang
(74) Attorney, Agent, or Firm — Edwards Wildman Palmer LLP

(57) ABSTRACT

Disclosed is a cationically polymerizable composition which shows improved storage stability and whose polymerization initiation temperature or curing temperature is controlled. In the case where the composition is thermosetting, it yields a cured product of three-dimensional structure excellent in mechanical properties, electrical properties, adhesive properties, heat resistance, moisture resistance, chemical resistance, and the like. The cationically polymerizable composition comprises a cationically polymerizable compound selected from vinyl compounds, lactones, cyclic ethers, and the like, a heteropolyacid selected from phosphotungstic acid, phosphomolybdic acid, silicotungstic acid, silicomolybdic acid, and the like as a cationic polymerization initiator, and a stabilizer selected from heteropolyacid salts as an inhibitor of cationic polymerization.

7 Claims, 2 Drawing Sheets

CATIONICALLY POLYMERIZABLE COMPOSITION AND METHOD FOR CONTROLLING CATIONIC POLYMERIZATION

TECHNICAL FIELD

This invention relates to a cationically polymerizable composition which shows excellent storage stability and whose curing temperature can be readily controlled and to a method for controlling cationic polymerization.

BACKGROUND TECHNOLOGY

Cationic polymerization is initiated by a cation generated from a cationic polymerization initiator and is not inhibited by oxygen. For this reason, cationic polymerization is not subject to such restriction as necessity of performing polymerization in an inert atmosphere and can be carried out advantageously in air rapidly and completely. A cationically polymerizable composition is suitable for use in paints, inks, adhesives, photoresists, molding materials, and the like and these applications demand not only excellent polymerizability but also good storage stability.

The prior-art documents relating to this invention are listed below.

Patent document 1: JP2001-200049 A
Patent document 2: JP2003-292606 A
Patent document 3: JP2001-30281 A
Patent document 4: JP3566397
Patent document 5: JP05-5006 A
Patent document 6: JP06-41215 A
Patent document 7: JP10-310633 A
Patent document 8: JP58-57429 A
Non-patent document 1: Kobunshi (High Polymers, Japan), 45, (3), 128 (1996)

The catalysts known for cationic polymerization include onium salts represented by sulfonium salts described in the patent documents 1, 2, 4, 5, and 6, diazonium salts and iodonium salts described in the patent document 1, and bisallene type metal complexes described in the patent document 3. Of these cationic polymerization catalysts, benzenesulfonium salts are studied most widely as described in the non-patent document 1 and some of them are commercially available as San-aid series from Sanshin Chemical Industry Co., Ltd. Compounds showing the highest activity among the aforementioned sulfonium salts, diazonium salts, and iodonium salts are antimony salts such as $SbF_6$, $SbCl_6$, and $SbF_5(OH)$. However, antimony is a highly toxic substance and is not desirable for practical use.

As an example of the means to solve the aforementioned problems, the use of a heteropolyacid as a curing agent for epoxy resins is described in the patent document 8. However, heteropolyacids are ultrastrong acids, show an extremely high curing activity, initiate curing at normal temperature to cause gelation in a short time, and show poor stability as a composition. Hence, heteropolyacids are difficult to use in practice.

DISCLOSURE OF THE INVENTION

Problems to be Solved by the Invention

This invention provides a cationically polymerizable composition comprising a heteropolyacid as a cationic polymerization initiator and showing improved storage stability and further provides a technique to control the conditions for polymerization or curing of the composition.

Means to Solve the Problems

A heteropolyacid has been known as an oxidation reaction catalyst and an acid catalyst and is used as a catalyst in the epoxidation of olefins by hydrogen peroxide, ring-opening polymerization reaction of tetrahydrofuran, hydration reaction, Friedel-Crafts reaction, and the like. However, the only example of the use of a heteropolyacid as a curing catalyst is the application to an epoxy resin described in the patent document 8. In this case, only a heteropolyacid is added to an epoxy compound that is highly reactive in the ring-opening polymerization reaction and the acid thus added is unable to control the reactivity and is poorly suitable for practical use. The inventors of this invention have paid their attention to the control of high acid strength of heteropolyacids, conducted intensive studies, and found that formulation of a cationically polymerizable composition from a cationically polymerizable compound, a heteropolyacid as a cationic polymerization initiator, and a stabilizer improves storage stability and, at the same time, the conditions for polymerization or curing of the composition can be controlled.

This invention relates to a cationically polymerizable composition comprising a cationically polymerizable compound, a heteropolyacid as a cationic polymerization initiator, and a stabilizer capable of inhibiting cationic polymerization. Further, this invention relates to a method for controlling cationic polymerization which comprises incorporating a heteropolyacid salt as a stabilizer performing the function of inhibiting cationic polymerization below a prescribed temperature in a composition comprising a cationically polymerizable compound and a heteropolyacid as a cationic polymerization initiator.

This invention will be described in detail below.

The cationically polymerizable composition of this invention comprises a cationically polymerizable compound (hereinafter referred to as cationically polymerizable compound or component A), a heteropolyacid as a cationic polymerization initiator (hereinafter referred to as heteropolyacid or component B), and a stabilizer capable of inhibiting cationic polymerization (hereinafter referred to as stabilizer or component C).

The cationically polymerizable compound or the component A is not specified and may be any of cationically polymerizable vinyl compounds, lactones, and cyclic ethers. The resins resulting from cationic polymerization vary in properties with the component A and are roughly divided into thermoplastic resins and curable resins (three-dimensionally crosslinked polymers). A preferable cationically polymerizable compound yields a resin that is solid at normal temperature or a curable resin.

The cationically polymerizable vinyl compounds include styrene, divinylbenzene, vinyl ether, and divinyl ether. The cationically polymerizable cyclic ethers include epoxy compounds, oxetane compounds, spiroorthoesters, bicycloorthoesters, and cyclic carbonates. A mixture of two kinds or more may be selected for use from the foregoing.

The epoxy compounds here mean compounds containing an oxirane group and include aromatic epoxy compounds, alicyclic epoxy compounds, and the like. The oxetane compounds mean compounds that contain an oxetane ring or a four-membered cyclic ether.

The presence of one or more cationically polymerizable functional groups such as vinyl and oxirane groups is sufficient in the aforementioned cationically polymerizable vinyl compounds, lactones, and cyclic ethers, but the presence of two or more functional groups is preferable in the case where the intended product is a curable resin.

The heteropolyacid or the component B to be used as a cationic polymerization initiator forms in the following manner. For example, molybdenum(VI) ions and tungsten(VI) ions become oxo acids in water and these oxo acids polymerize to yield polyoxo acids having high molecular weight. During this polymerization, not only oxo acids of the same kind polymerize by themselves but also oxo acids of one kind polymerize around oxo acids of another to form heteropolyacids. The element forming the oxo acids in the center is called a hetero element while the element forming the oxo acids that polymerize around the oxo acids in the center is called a poly element. The hetero elements include Si, P, As, S, Fe, and Co and the poly elements include Mo, W, and V. A variety of poly elements can access the hetero elements during polymerization and various combinations of poly and hetero elements can produce a large variety of heteropolyacids. The heteropolyacid of this invention includes an acidic heteropolyacid salt in which the hydrogen atoms are partly replaced with metal atoms and yet the residual hydrogen atoms show the properties of a heteropolyacid and the activity as a polymerization initiator.

Any heteropolyacid that is active as a cationic polymerization initiator may be used as the component B and a mixture of two kinds or more of heteropolyacids may be used. Phosphotungstic acid, phosphomolybdic acid, silicotungstic acid, and silicomolybdic acid are preferable on account of their good curability and ready availability and silicotungstic acid and silicomolybdic acid are more preferable.

The amount of the component B to be incorporated is preferably in the range of 0.01 to 10 parts by weight, more preferably in the range of 0.02 to 5 parts by weight, per 100 parts by weight of the component A. Incorporation of less than 0.01 part by weight of the component B deteriorates curability and processability while incorporation of more than 10 parts by weight deteriorates storage stability.

The heteropolyacid may be used as dissolved or dispersed in the cationically polymerizable compound or it may be dissolved in a solvent and used as a solution. Any solvent that does not hinder the catalytic performance of the heteropolyacid in cationic polymerization and is capable of dissolving the heteropolyacid may be used; examples are polar solvents such as water, methanol, ethanol, THF, DMF, and DMAc and nonpolar solvents such as toluene and xylene. Furthermore, a high-boiling polar solvent that does not volatilize nor generates bubbles with ease during thermal curing can be used advantageously; examples are propylene carbonate, ethylene carbonate, γ-butyrolactone, diethylene glycol dimethyl ether, and methyl carbitol.

The component C or the stabilizer to inhibit cationic polymerization preferably inhibits cationic polymerization below a prescribed temperature. Inhibition of cationic polymerization below a prescribed temperature means control of the activity of a cationic polymerization catalyst during storage to improve storage stability. The prescribed temperature is, for example, below 100° C., preferably below 200° C., although it varies with the temperature for storage. In the case where a cationically polymerizable composition is cured by radiation such as UV, the stabilizer may inhibit cationic polymerization below a prescribed intensity (or quantity) of radiation.

The aforementioned stabilizers are described for onium salts, typically sulfonium salts, in the patent documents 1 through 7, for diazonium salts and iodonium salts in the patent document 1, and for bisallene type metal complexes in the patent document 3. For example, the following compounds are described as stabilizers in the patent documents: imidazole-epoxy adducts, dicyandiamide, and organic acid hydrazides in the patent document 1; tertiary alkanolamines and tertiary alkylamines in the patent document 2; quinoline compounds in the patent document 3; guanidine compounds, thiazole compounds, thiourea compounds, ethylenethiourea, and alkyl phenyl sulfide compounds in the patent document 4; onium salts having a nucleophilic counter anion selected from halogen ions, chlorate ions, alkylsulfate ions, and p-toluenesulfonate ions in the patent documents 5 and 6; compounds containing a urethane linkage, an amide linkage, a urea linkage, or a carbodiimide linkage in the molecule, dialkylaminopyridine compounds, and protic acid compounds in the patent document 7.

The aforementioned patent documents contain no description of application of the stabilizers therein described to heteropolyacids. It has now been found that they are effective as stabilizers of heteropolyacids and capable of controlling the conditions for polymerization or curing. It has further been found that the salts of heteropolyacids are effective as stabilizers of heteropolyacids. Therefore, heteropolyacid salts can be used as the component C in addition to the known stabilizers described in the aforementioned patent documents and these stabilizers may be used as a mixture of two kinds or more.

The heteropolyacid salts include alkali metal salts, alkaline earth metal salts, ammonium salts, and organic salts such as pyridinium salts and quinolinium salts. The sodium salts, potassium salts, cesium salts, calcium salts, ammonium salts, and pyridinium salts are preferred for their adequate solubility and ease of availability.

The amount of the component C to be incorporated is 0.1 to 100 parts by weight, preferably 1 to 50 parts by weight, per 100 parts by weight of the component B, although it varies with the amount and kind of the component B in use. When the amount of the component C incorporated is below the specified range, the storage stability of a cationically polymerizable composition deteriorates. When the component C is incorporated in excess, the curing may be hindered and the cured product exhibits inferior properties. It becomes possible to control the temperature or conditions for initiation of polymerization freely within a certain range by varying the kind and amount of the components B and C.

The cationically polymerizable composition of this invention is obtained by compounding the aforementioned components A, B, and C and, if necessary, other components. Such other components include solvents and a variety of known additives such as inorganic fillers, reinforcements, colorants, stabilizers (heat stabilizers, weatherability improvers, and the like), extenders, viscosity control agents, flame retardants, ultraviolet absorbers, antioxidants, discoloration inhibitors, antibacterial agents, antifungal agents, age resistors, antistatic agents, plasticizers, lubricants, foaming agents, and mold release agents. These additives are used in such amounts as not to destroy the effect of this invention. The cationically polymerizable composition of this invention may be in the form of liquid, paste, or solid and it is preferably liquid or paste from the standpoint of effecting uniform compounding.

The cationically polymerizable composition of this invention is formulated, then usually stored at a temperature below normal temperature, transported to a site where it is used, and polymerized by such means as heating.

The cationically polymerizable composition of this invention is polymerized or advantageously cured in the usual manner by heating to yield a polymer or advantageously a cured product. This thermal polymerization or thermal curing (hereinafter referred to as thermal polymerization or curing) is preferably carried out by keeping the composition dissolved in a reaction solvent or keeping the composition in the molten state without a solvent. Therefore, in the case of thermal polymerization or curing in the dissolved state, the temperature is preferably kept in the range of 50 to 300° C. On the other hand, in the case of thermal polymerization or curing in the molten state, the temperature is preferably kept above the melting point of the cationically polymerizable compound and below 300° C.

The pressure during thermal polymerization or curing is not restricted and thermal polymerization or curing is carried out under reduced pressure, at normal pressure, or under pressure. The time for thermal polymerization or curing, although it varies with the kind of component in the composition and with the conditions of thermal polymerization or curing, is in the range of 0.1 to 10 hours, preferably in the range of 0.5 to 3 hours. Thermal polymerization or curing is preferably carried out in an atmosphere of inert gas such as nitrogen, argon, and helium.

The aforementioned reaction solvent is preferably capable of swelling the cationically polymerizable compound and inert to the components in the composition. The reaction solvent is used in an amount just sufficient to dissolve or swell the components in the composition and, in the case where a polar solvent such as DMF, DMAC, HMPA, DMSO, and NMP to be described later is used, the solvent is used at a rate of 1 to 10 units per 1 unit by weight of the cationically polymerizable compound.

The reaction solvents of the aforementioned kind include amides such as N,N-dimethylformamide (DMF), N,N-dimethylacetamide (DMAC), and hexamethyl phosphoric triamide (HMPA), ethers such as diethylene glycol dimethyl ether, diethylene glycol diethyl ether, triethylene glycol dimethyl ether, anisole, and phenetole, halogenated aromatic hydrocarbons such as o-dichlorobenzene and 3,4-dichlorotoluene, nitrobenzene, dimethyl sulfoxide (DMSO), sulfolane, tetramethylurea, and N-methyl-2-pyrrolidone (NMP). Of these solvents, DMF, DMAC, HMPA, DMSO, and NMP are preferred.

The cationically polymerizable composition is thermally polymerized or cured, cooled to normal temperature in the usual manner by air or water, and the product polymer or the cured product is taken out of the reactor. If necessary, the product is further dried below 100° C. for 2 to 10 hours by a known technique such as hot-air drying, vacuum drying, and freeze drying. When a thermosetting composition is thermally cured in a reaction solvent, the cured product is obtained by evaporating the solvent before cooling the reaction product or the cured product is obtained as a flexible product containing the reaction solvent by cooling the reaction product. In the case where the product polymer is a thermosetting resin, it gives an insoluble and infusible cured product of three-dimensional structure as it is or after further thermal curing. When the product polymer is a thermoplastic resin, it is recovered by such means as vacuum deaeration in the molten state.

Furthermore, the cationically polymerizable composition of this invention may be applied to a base material such as metal, rubber, plastics, molded parts, film, paper, wood, glass cloth, concrete, and ceramic and converted into a resin or a cured product by heating at a prescribed temperature for a prescribed period of time; that is, a base material coated with a film of the cured product or the resin of the composition may be obtained.

PREFERRED EMBODIMENTS OF THE INVENTION

This invention will be described concretely with reference to the examples. The term "part" means part by weight.

The following materials were used in the examples and comparative examples and they were used as received without further purification.

Component A
OXBP: 4,4'-Bis[(3-ethyl-3-oxetanyl)methoxymethyl]biphenyl, manufactured by Ube Industries, Ltd.

Component B
Silicotungstic acid, manufactured by Nippon Inorganic Colour & Chemical Co., Ltd.

Component C
Sodium silicotungstate, manufactured by Nippon Inorganic Colour & Chemical Co., Ltd.

Other materials were described in the specification.

The polymerization initiation temperature of a cationically polymerizable composition was measured by DSC. Measurements were made in the range of 0 to 275° C. while raising the temperature at a rate of 10° C./min.

EXAMPLE 1

Figure 1:
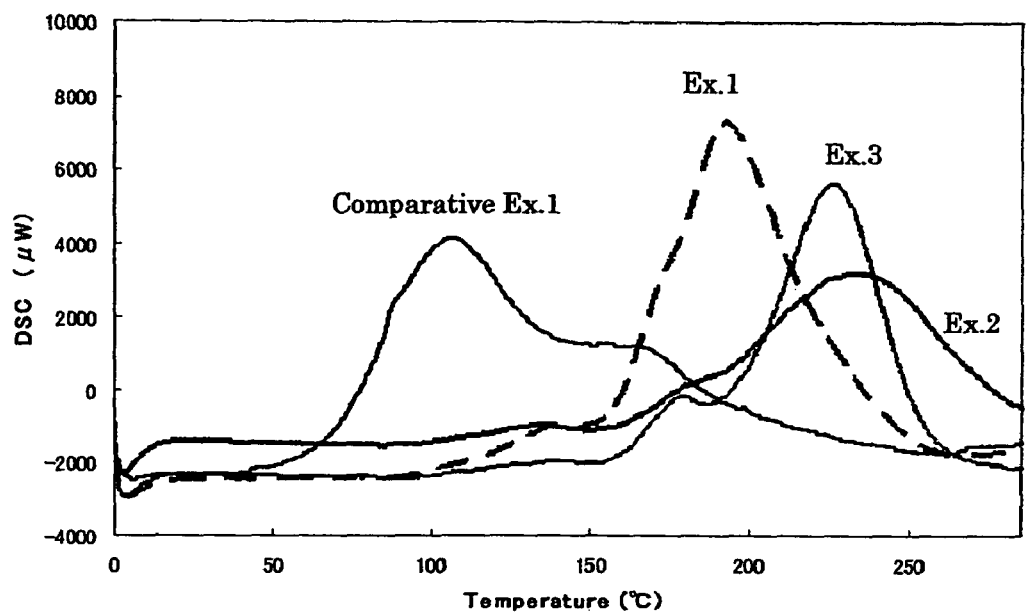
FIG. 1 is a DSC chart of a cationically polymerizable composition.

A solution of 0.02 part by weight of silicotungstic acid in 0.38 part by weight of propylene carbonate and 0.002 part by weight of p-hydroxyphenyldimethylsulfonium sulfate were added to 100 parts by weight of OXBP and the mixture was stirred to give a cationically polymerizable composition. The result of DSC measurement is shown in FIG. 1.

EXAMPLE 2

A solution of 0.02 part by weight of silicotungstic acid in 0.38 part by weight of propylene carbonate and 0.002 part by weight of 1,3-diethyl-2-thiourea were added to 100 parts by weight of OXBP and the mixture was stirred to give a cationically polymerizable composition. The result of DSC measurement is shown in FIG. 1.

EXAMPLE 3

A solution of 0.02 part by weight of silicotungstic acid in 0.38 part by weight of propylene carbonate and 0.002 part by weight of 1,3-diphenylguanidine were added to 100 parts by weight of OXBP and the mixture was stirred to give a cationically polymerizable composition. The result of DSC measurement is shown in FIG. 1.

EXAMPLE 4

Figure 2:
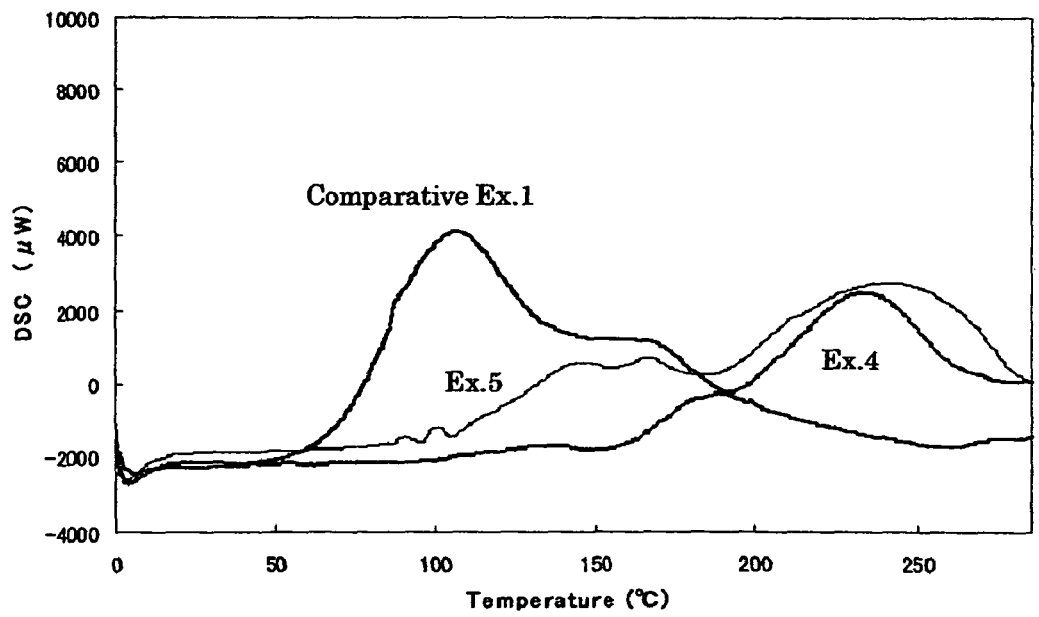
FIG. 2 is a DSC chart of a cationically polymerizable composition.

A solution of 0.02 part by weight of silicotungstic acid in 0.38 part by weight of propylene carbonate and 0.002 part by weight of trimethylthiourea were added to 100 parts by weight of OXBP and the mixture was stirred to give a cationically polymerizable composition. The result of DSC measurement is shown in FIG. 2.

EXAMPLE 5

A solution of 0.02 part by weight of silicotungstic acid in 0.38 part by weight of propylene carbonate and 0.002 part by weight of quinoline were added to 100 parts by weight of OXBP and the mixture was stirred to give a cationically polymerizable composition. The result of DSC measurement is shown in FIG. 2.

EXAMPLE 6

Figure 3:
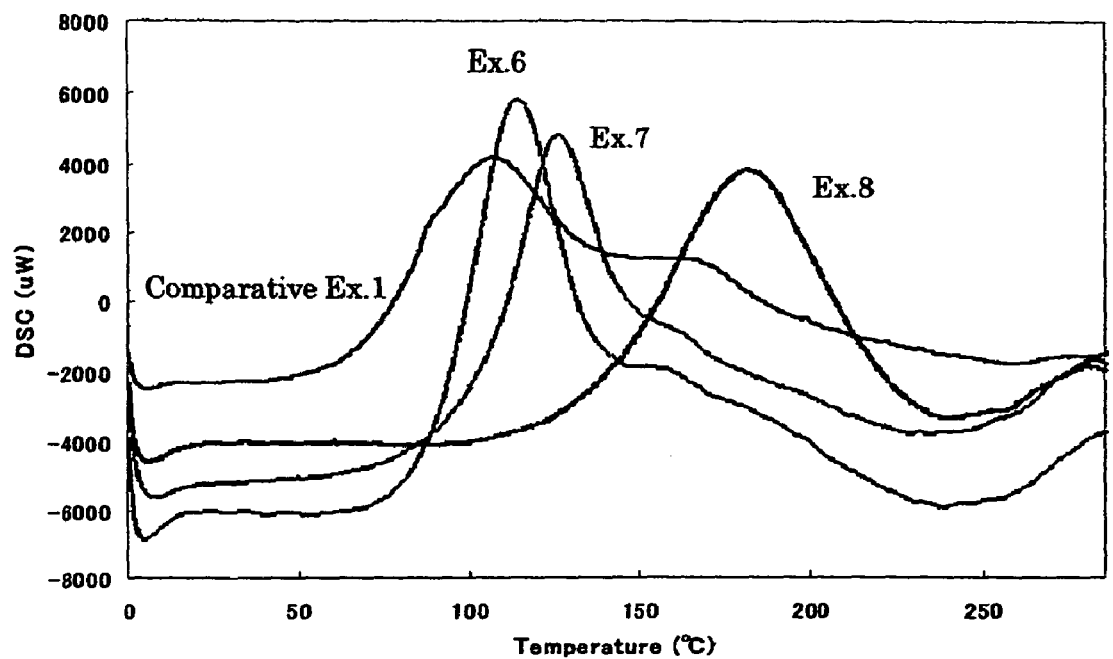
FIG. 3 is a DSC chart of a cationically polymerizable composition.

A solution of 0.02 part by weight of silicotungstic acid in 0.38 part by weight of propylene carbonate and 0.002 part by weight of sodium silicotungstate were added to 100 parts by weight of OXBP and the mixture was stirred to give a cationically polymerizable composition. The result of DSC measurement is shown in FIG. 3.

EXAMPLE 7

A solution of 0.02 part by weight of silicotungstic acid in 0.38 part by weight of propylene carbonate and 0.004 part by weight of sodium silicotungstate were added to 100 parts by weight of OXBP and the mixture was stirred to give a cationically polymerizable composition. The result of DSC measurement is shown in FIG. 3.

EXAMPLE 8

A solution of 0.02 part by weight of silicotungstic acid in 0.38 part by weight of propylene carbonate and 0.01 part by weight of sodium silicotungstate were added to 100 parts by weight of OXBP and the mixture was stirred to give a cationically polymerizable composition. The result of DSC measurement is shown in FIG. 3.

COMPARATIVE EXAMPLE 1

A solution of 0.02 part by weight of silicotungstic acid in 0.38 part by weight of propylene carbonate was added to 100 parts by weight of OXBP and the mixture was stirred to give a cationically polymerizable composition. The result of DSC measurement is shown in FIGS. 1, 2, and 3.

As shown in FIGS. 1, 2, and 3, it is possible to improve the storage stability of a cationically polymerizable compound and control the curing temperature with the use of a cationically polymerizable composition formulated according to this invention.

Industrial Applicability

The storage stability of a cationically polymerizable compound containing a heteropolyacid as a cationic polymerization initiator can be improved and the polymerization initiation temperature or curing temperature of the compound can be controlled. The storage stability is improved markedly while maintaining good catalytic activity of the heteropolyacid in polymerization or curing. In the case where the cationically polymerizable composition is thermosetting, it cures to yield an insoluble and infusible product of three-dimensional structure showing excellent mechanical properties (tensile strength, hardness, and the like), electrical properties (insulation properties and the like), adhesive properties, heat resistance, moisture resistance, and chemical resistance. It is fully expected that the composition is applicable to paints, coatings, adhesives, electrically insulating materials, encapsulating materials, laminated sheets, repair of concrete structures, and bonding of reinforcing steel sheets.

The invention claimed is:

1. A cationically polymerizable composition comprising
  (A) an oxetane compound as a cationically polymerizable compound,
  (B) a heteropolyacid as a cationic polymerization initiator, and
  (C) a stabilizer capable of inhibiting cationic polymerization
  wherein 100 parts by weight of the cationically polymerizable compound is compounded with the heteropolyacid,
  the stabilizer is a heteropolyacid salt capable of inhibiting cationic polymerization below a prescribed temperature;
  the amount of the component B to be incorporated is in the range of 0.02 to 5 parts by weight, per 100 parts by weight of the component A, and
  the amount of the component C to be incorporated is 1 to 50 parts by weight, per 100 parts by weight of the component B.

2. The cationically polymerizable composition as described in claim 1 wherein the heteropolyacid is phosphotungstic acid, phosphomolybdic acid, silicotungstic acid, silicomolybdic acid or a mixture thereof.

3. The cationically polymerizable composition as described in claim 1 wherein the cationically polymerizable compound comprises a mixture of an oxetane compound and at least one of a cationically polymerizable vinyl compound and a cationically polymerizable lactone.

4. The cationically polymerizable composition as described in claim 1 wherein the heteropolyacid salt is heteropolyacid sodium salt, heteropolyacid potassium salt, heteropolyacid calcium salt, heteropolyacid cesium salt, heteropolyacid ammonium salt, heteropolyacid pyridinium salt or a mixture thereof.

5. A method for controlling cationic polymerization of a cationically polymerizable composition below a prescribed temperature which comprises
  incorporating a heteropolyacid salt as a stabilizer (C) in a composition comprising an oxetane compound as a cationically polymerizable compound (A) and a heteropolyacid as a cationic polymerization initiator (B) and
  compounding 100 parts by weight of the cationically polymerizable compound and the heteropolyacid,
  wherein the stabilizer (C) is a heteropolyacid salt capable of inhibiting cationic polymerization below a prescribed temperature;
  the amount of the component B to be incorporated is in the range of 0.02 to 5 parts by weight, per 100 parts by weight of the component A, and
  the amount of the component C to be incorporated is 1 to 50 parts by weight, per 100 parts by weight of the component B.

6. The cationically polymerizable composition as described in claim 2 wherein the cationically polymerizable compound comprises a mixture of an oxetane compound, and at least one of a cationically polymerizable vinyl compound and a cationically polymerizable lactone.

7. The cationically polymerizable composition as described in claim 2 wherein the heteropolyacid salt is heteropolyacid sodium salt, heteropolyacid potassium salt, heteropolyacid calcium salt, heteropolyacid cesium salt, heteropolyacid ammonium salt, heteropolyacid pyridinium salt or a mixture thereof.

* * * * *